(12) United States Patent
Grayson et al.

(10) Patent No.: US 10,720,560 B2
(45) Date of Patent: Jul. 21, 2020

(54) SYSTEM AND METHOD FOR NANOWIRE-ARRAY TRANSVERSE THERMOELECTRICS

(71) Applicant: Northwestern University, Evanston, IL (US)

(72) Inventors: Matthew Grayson, Evanston, IL (US);
Mark C Hersam, Wilmette, IL (US);
Chuanle Zhou, Evanston, IL (US);
Yang Tang, Evanston, IL (US); Tejas Shastry, Washington, IL (US)

(73) Assignee: Northwestern University, Evanston, IL (US)

( * ) Notice: Subject to any disclaimer, the term of this patent is extended or adjusted under 35 U.S.C. 154(b) by 25 days.

(21) Appl. No.: 14/850,014

(22) Filed: Sep. 10, 2015

(65) Prior Publication Data

US 2016/0079509 A1 Mar. 17, 2016

Related U.S. Application Data

(60) Provisional application No. 62/048,952, filed on Sep. 11, 2014.

(51) Int. Cl.
*H01L 35/32* (2006.01)
*H01L 35/22* (2006.01)
(Continued)

(52) U.S. Cl.
CPC .............. *H01L 35/32* (2013.01); *H01L 35/16* (2013.01); *H01L 35/18* (2013.01); *H01L 35/22* (2013.01); *H01L 35/24* (2013.01); *H01L 35/34* (2013.01)

(58) Field of Classification Search
CPC ........... H01L 21/02603; H01L 51/0048; H01L 43/12; H01L 29/0665; H01L 29/0669; H01L 29/0676; H01L 35/00; H01L 35/18; H01L 35/22; H01L 35/26; H01L 35/28; H01L 35/32; H01L 35/34; H01L 35/16; H01L 35/24; Y02E 60/13; B82Y 10/00; B82Y 30/00; B82Y 40/00

See application file for complete search history.

(56) References Cited

U.S. PATENT DOCUMENTS

2005/0181587 A1* 8/2005 Duan .................. B82Y 10/00
438/551
2009/0117741 A1* 5/2009 Heath ................... B82Y 10/00
438/694

(Continued)

FOREIGN PATENT DOCUMENTS

JP  WO 2007141890 A1 * 12/2007 ............ H01L 35/32
WO     2009125317 A2    10/2009

OTHER PUBLICATIONS

Machine translation of WO 2007/141890, Nakamura et al. retrieved from https://patentscope.wipo.int on Aug. 21, 2017.*
Babin, et al., "Anisotropic synthetic thermoelements and their maximum capabilities," Soy. Phys. Semicond., 8:4, Oct. 1974, pp. 478-481.

(Continued)

*Primary Examiner* — Mayla Gonzalez Ramos
(74) *Attorney, Agent, or Firm* — Benesch, Friedlander, Coplan & Aronoff LLP

(57) ABSTRACT

A transverse thermoelectric includes a first array of hole-conducting nanowires and a second array of electron-conducting nanowires positioned orthogonal to the first array of nanowires. A substrate provides structure to the first array of nanowires and the second array of nanowires.

19 Claims, 8 Drawing Sheets

(51) Int. Cl.
*H01L 35/34* (2006.01)
*H01L 35/24* (2006.01)
*H01L 35/16* (2006.01)
*H01L 35/18* (2006.01)

(56) References Cited

U.S. PATENT DOCUMENTS

| | | | | |
|---|---|---|---|---|
| 2009/0133731 A1* | 5/2009 | Grebel | ............... | B82B 1/00 136/200 |
| 2010/0212711 A1* | 8/2010 | Liu | ............... | H01L 35/30 136/205 |
| 2013/0174884 A1* | 7/2013 | Grayson | ............... | H01L 35/28 136/203 |

OTHER PUBLICATIONS

Goldsmid, "Chapter 11 Transverse Devices," Introduction to Thermoelectricity, Springer, 2010, 13 pages.
Reitmaier, et al., "Transverse thermoelectric devices," Appl. Phys. A 99, 2010, pp. 717-722.
Snarskii, et al. "Anisotropic Thermoelements," Thermoelectrics Handbook: Macro to Nano, Edited by Rowe, Taylor & Francis, Chapt. 45., 2006, pp. 45-1-45-11.
Takahashi, et al., "Bifunctional thermoelectric tube made of tilted multilayer material as an alternative to standard heat exchangers," Scientific Reports, 3:1501, 2013, pp. 1-5.
Zhou, et al., "Driving Perpendicular Heat Flow: (p x n)-Type Transverse Thermoelectrics for Microscale and Cryogenic Peltier Cooling," Physical Review Letters, 110:227701, 2013, pp. 227701-1-227701-5.

* cited by examiner

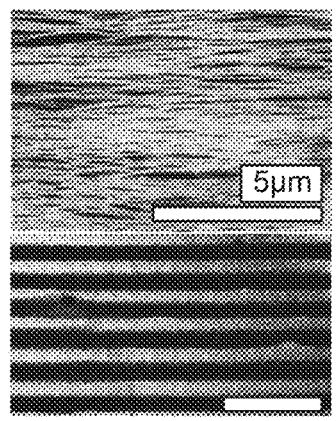
Figure 4A
Figure 4B
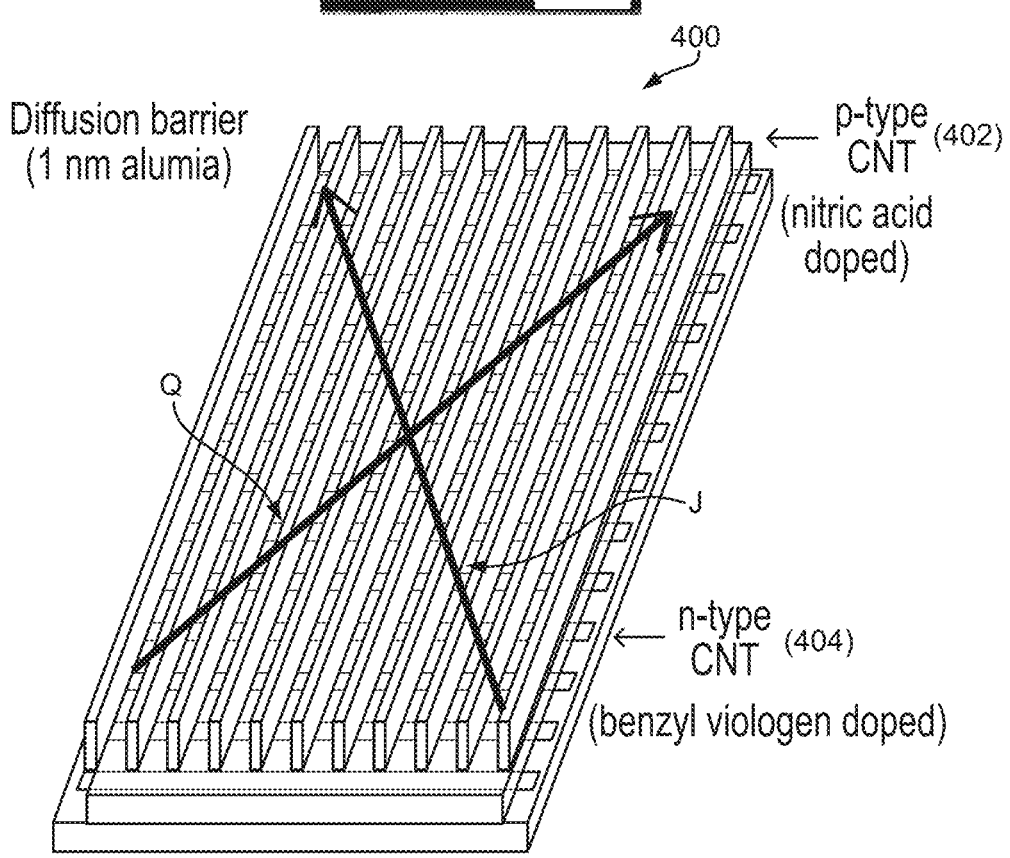
Figure 4C

SYSTEM AND METHOD FOR NANOWIRE-ARRAY TRANSVERSE THERMOELECTRICS

CROSS-REFERENCE TO RELATED APPLICATION

This application claims the benefit of U.S. Provisional Application Ser. No. 62/048,952, filed Sep. 11, 2014, which is incorporated in its entirety herein.

STATEMENT OF U.S. GOVERNMENT SUPPORT

This invention was made with government support under FA9550-12-1-0169 awarded by the Air Force Office of Scientific Research and DMR1006391 awarded by the National Science Foundation. The government has certain rights in the invention.

BACKGROUND

Longitudinal thermal coolers and generators are commercially known for their reliability, light-weight, and application in waste energy harvesting, but they are not flexible, nor can they be integrated at very small scales.

BRIEF DESCRIPTION OF DRAWINGS

FIG. 4A is an exemplary nanoscale view of carbon nanotube (CNT) arrays fabricated via a self-assembly method show a high degree of alignment which in FIG. 4B form stripes along a substrate, and FIG. 4C is a perspective view of how aligned carbon nanotube films may constitute a transverse thermoelectric.

DESCRIPTION

The systems and methods provide for transverse thermoelectrics implemented with nanowires. The nanowires can be manufactured from carbon nanotubes (CNT) or other types of nanowires, e.g., gallium arsenide nanowire, indium arsenide nanowire, germanium nanowire, silicon nanowire, bismuth selenide nanowire, bismuth telluride nanowire etc. For purposes of explanation, the transverse thermoelectrics are described generally as nanowire.

Transverse thermoelectrics applied as Peltier coolers can be shaped to reach very low temperatures independent of the material's figure of merit, and scaling down to micron size can be much easier than standard longitudinal thermal coolers and generators due to the simple structure. As a transverse thermoelectric material, nanowire arrays have various additional advantages. The ease of production and low cost of material makes the price of nanowire thermoelectrics almost one tenth that of industry standards. In addition, the thermoelectric power per unit mass is as much as five times greater the industry standard. Also, nanowire and/or other materials can be combined with polymers to produce flexible and durable transverse thermoelectrics and for easy integration into nanowire-based flexible electronics for active thermal management.

Figure 1:
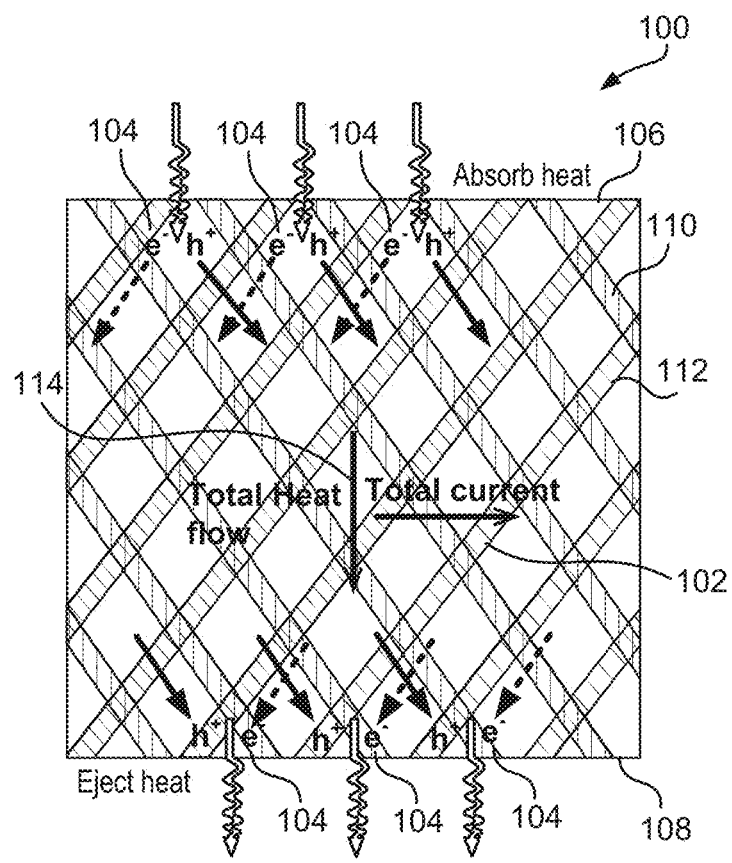
FIG. 1 is a side view of an exemplary semiconductor body for a transverse thermoelectric cooler.

FIG. 1 is a side view of an exemplary transverse thermoelectric cooler 100. With an applied electrical current I 102, electron-hole pairs 104 are generated at a first surface, e.g., top surface 106 absorbing heat, and recombine at a second surface, e.g., bottom surface 108 giving off heat, cooling the top surface 106. The electrical current I 102 causes the heat to flow from the top surface 106 to the bottom surface 108 to cool the top surface 106. Alternatively the direction of current I 102 can cause heat to flow to the top surface 106. The electrons $e^-$ and holes $h^+$ are provided in an anisotropic material that causes the electrons $e^-$ and holes $h^+$ to predominantly move orthogonally to each other. In one implementation, arrays of p-type nanowires 110 and n-type nanowires 112 positioned on a substrate (see e.g., 304 of FIG. 3) fabric are used to manufacture the transverse thermoelectrics. One example of a substrate 304 is a flexible polymer. Due to the positioning of the p-type nanowires 110 and n-type nanowires 112, the heat flow 114 is transverse to the electrical current 102. The p-type nanowires 110 and n-type nanowires 112 can include carbon nanotube wires, and/or other types of nanowire can be used alternative to or in addition to the p-type nanowires 110 and n-type nanowires 112.

Transverse thermoelectric phenomena function in that the directional symmetry of the Seebeck tensor is broken. Aligned p-type nanowires 110 and n-type nanowires 112 can satisfy this requirement due to their anisotropic low dimensional structure. By stacking n-type nanowires 112 and orthogonally oriented p-type nanowires 110, the heat flow 114 can move transversely to the electrical current. The n-type nanowires 112 and p-type nanowires 110 can be positioned perpendicular to each other or at other angles bigger or smaller than 90 degrees. For example, geometrically structured CNT transverse thermoelectrics with cross-aligned p-type nanowires 110 and n-type nanowires 112 can have larger effective thermal power than the randomly oriented single-type CNTs.

Figure 2:
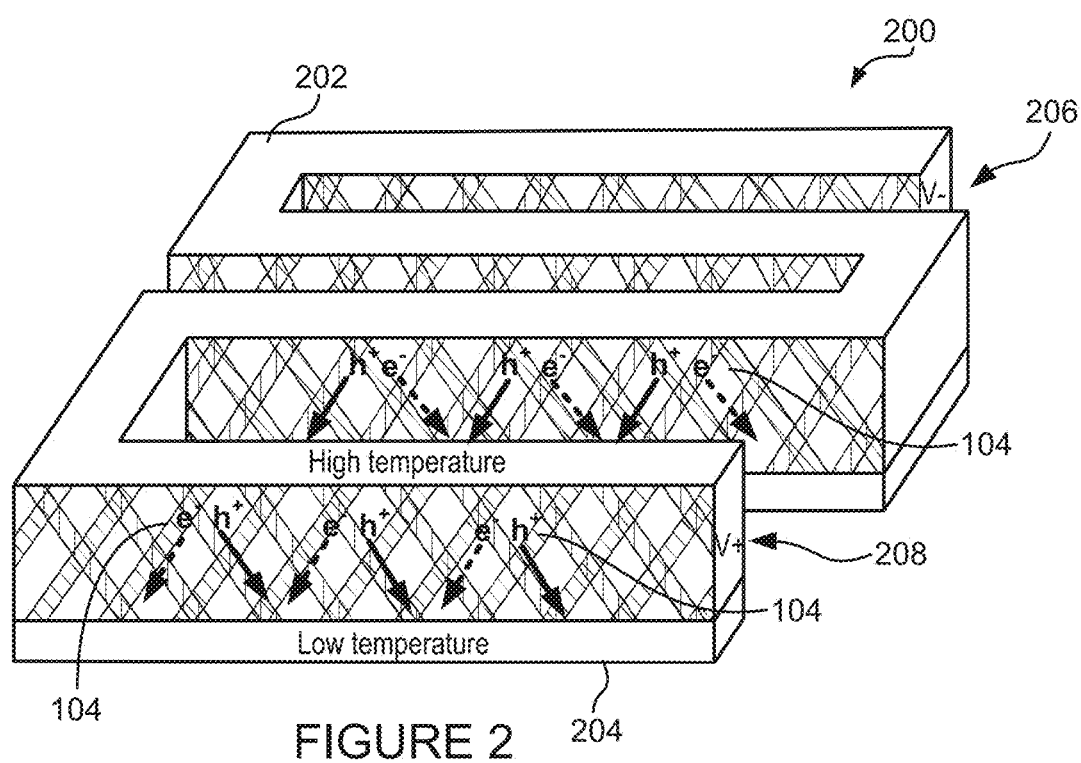
FIG. 2 is a perspective view of an exemplary transverse thermoelectric generator.

FIG. 2 is a perspective view of an exemplary transverse thermoelectric generator 200. The cooling process of FIG. 1 can be inverted to create the thermoelectric generator 200. As heat flows from a hot region to a cool region, or vice versa, the energy from the heat flow can be extracted to create a voltage or drive an electrical current across the thermoelectric generator 200. With a temperature gradient across a first 202, e.g., top surface, and a second 204, e.g., bottom surface, electron-hole pairs 104 are created at the top surface and form a voltage difference from V− 206 and V+ 208 at the longitudinal ends of the transverse thermoelectric generator 200. A meandering shape of the material can generate a large voltage difference as high as kilovolts from a small temperature gradient. For thermoelectric generators 200, different layers can be connected in series through electrodes on the side of the fabric to increase the total Seebeck voltage, and parallel structure can be adopted to decrease the total resistance of the fabric and thus increase the maximum output power.

Figure 3:
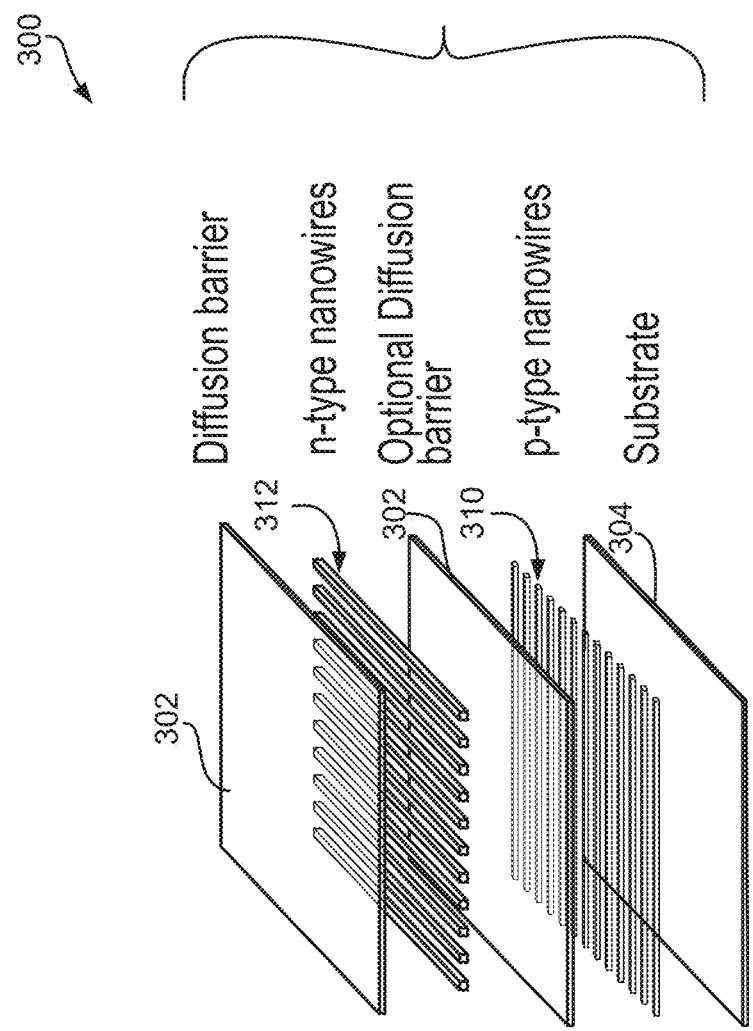
FIG. 3 shows an example implementation of a nanowire-array transverse thermoelectric device by depositing n-type nanotubes and orthogonally oriented p-type nanotubes alternatively.

FIG. 3 is an illustration of an example nanowire transverse thermoelectric 300 made by depositing parallel n-type nanowires 112 and orthogonally oriented parallel p-type nanowires 110, or vice versa. The cross-aligned p-type nanowires 110 and n-type nanowires 112 are used to produce the transverse thermoelectric coolers 100 and generators 200 mentioned above. Aligned n-type nanowires 112 and orthogonally oriented p-type nanowire 110 are deposited alternatively to form the electron $e^-$ and hole $h^+$ conducting channels in FIGS. 1 and 2. The electrons e flow along the n-type nanowire 112 and the holes $h^+$ flow along the p-type nanowires 110 to control the flow of the electrons $e^-$ and the holes $h^+$.

Referring to FIGS. 1-3, since the p-type nanowires 110 and n-type nanowires 112 are small enough to be flexible, when deposited on the substrate 304, e.g., a thin, flexible transverse thermoelectric fabric is produced that can be formed into different shapes and/or wrapped around any object. The substrate 304 can provide structure to the p-type nanowires 110 and n-type nanowires 112 and the diffusion barrier. Since the heat flow 114 is perpendicular to the current flow 102, the transverse thermoelectric generators and coolers can be shaped to enhance performance, e.g., for thermoelectric generators 200, the longer the dimension perpendicular to both the heat differential and the current direction, the more current flow without changing the heat differential. Alternately, the longer the dimension perpendicular to the heat differential but parallel to the current flow, the more voltage without changing the heat differential. The thin, flexible transverse thermoelectric fabric can be mass produced and portable, e.g. fabricated on rollers by the yard and shipped for implementing in different applications. The transverse thermoelectric generators 200 or coolers 100 are scalable, e.g., based on quality, and fabrics can be stitched together end-on-end to create larger voltage drops.

For example, a flexible, transverse thermoelectric cooler 100 can be integrated into flexible electronics, used for making clothing, electric blankets, covers for buildings, etc. to keep the electronics and wearers of the fabrics, etc. cool. Moreover, as transverse thermoelectric generators 200, small thermal differences of waste heat can be converted to large voltages (kV range) by geometrically shaping the flexible materials to fit the environment. Such power generators can be integrated into fabrics for easy placement on any heat source for power generation from waste heat. For example, one can position the transverse thermoelectric generator 200 in bodies of water like the ocean that have a warm upper layer and a cool lower layer to generate power from this thermal differential. The top surface 202 of the transverse thermoelectric generator 200 can be placed in the warm region of the water and the bottom surface 204 in the cool region to generate voltage or drive an electric current based on the temperature difference. The flexible transverse thermoelectric fabric can also be curled around rods for waste energy harvesting, etc. Clothing can be manufactured to harvest body heat to generate voltages and currents, e.g., to power or recharge electronics connected with the clothing, e.g., watches, phones, music players, computers, etc. The transverse thermoelectric fabrics can also be used in places that are difficult to position other power sources, where solar power or wind are unavailable, such as near the tip of an oil drill or deep in the ocean, e.g., for powering batteries on submarines.

FIG. 4A is an exemplary nanoscale view of fabricated carbon nanotube (CNT), e.g., n-doped nanotubes 402 and p-doped nanotubes 404. The CNT arrays 400 show a high degree of alignment and form FIG. 4B stripes along a substrate. The example scale bar in FIG. 4B is 20 microns. An evaporation-driven self-assembly method causes CNTs to align into dense anisotropic networks (FIG. 4A) at the edge of a water meniscus while competing surface tension forces cause the meniscus to recede. This competition of forces creates an array of separated CNT stripes on a hydrophilic substrate (FIG. 4B). Once deposited, the array can be doped p-type or n-type through chemical treatments. An optional thin dielectric (either organic or inorganic) acts as a diffusion barrier between alternating p and n-type layers as well as a fresh surface for the next step of self-assembly. The bracketed structure in FIG. 3 can be repeated many times to increase the overall heat flow created by the thin-film device, resulting in a multilayer CNT fabric that could be used as a transverse thermoelectric.

FIG. 4C is a perspective view of aligned carbon nanotube films 400 as transverse thermoelectrics. An oriented layer of n-doped nanotubes 402 can be overlaid with an optional dopant diffusion barrier, followed by a perpendicularly oriented layer of p-doped nanotubes 404. When a net electrical current J made of positive and negative charge carriers flows at a 45° angle to this array, a perpendicular heat flow Q can result defining transverse thermoelectric behavior. The transverse thermoelectrics can create efficient Peltier nanocoolers and thermoelectric generators for waste heat recovery.

Transverse thermoelectrics have advantages over standard longitudinal thermoelectrics, namely 1) they are scalable down to the nanoscale while retaining useful thermoelectric function, 2) they can function well at all temperatures, even cryogenic temperatures where standard longitudinal thermoelectrics freeze out, and 3) they can be shaped to cool to arbitrarily low temperatures even if their thermoelectric figure of merit ZT may be suboptimal. Transverse thermoelectrics operate on the principle that a Seebeck tensor in an anisotropic semiconductor can be engineered to have large off-diagonal components, so that longitudinal drive currents can induce transverse heat flow.

Candidates for such materials are intrinsic semiconductors which have p-type conduction in one direction, and n-type conduction perpendicular, and many applications for such thermoelectric materials become possible. For example, with such transverse thermoelectrics a thermoelectric refrigeration skin of any shape that cools whatever it covers when currents flow within the layer can be implemented, or a thermoelectric generator that converts a few degrees of thermal gradient to kilovolts of thermomotive force, or a nanoscale Peltier cooler for cooling individual infrared pixels. These properties arise from the transverse thermoelectrics separating the direction and cross-sectional area of heat flow from the direction and cross-sectional area of electrical current flow.

The characteristic of a transverse thermoelectric material is that both electrons $e^-$ and holes $h^+$ contribute to the conduction, with electrons dominating conductivity in one direction, and holes dominating conductivity orthogonal. The tacked nanotube films can function as a transverse thermoelectric when the two n- and p-doped layers 402, 404 of semiconducting nanotubes are oriented orthogonal to each other. When an electrical current J is driven at +45° degrees with respect to these principal axes the result is a large off-diagonal Seebeck coefficient S resulting in transverse heat flow Q at −45°. For thermoelectrics, the performance can be determined in terms of a transverse thermoelectric figure of merit $Z_\perp T = S^2 T/\rho\kappa$, which can be optimized by reducing both the resistivity and the thermal conductivity.

Figure 5:
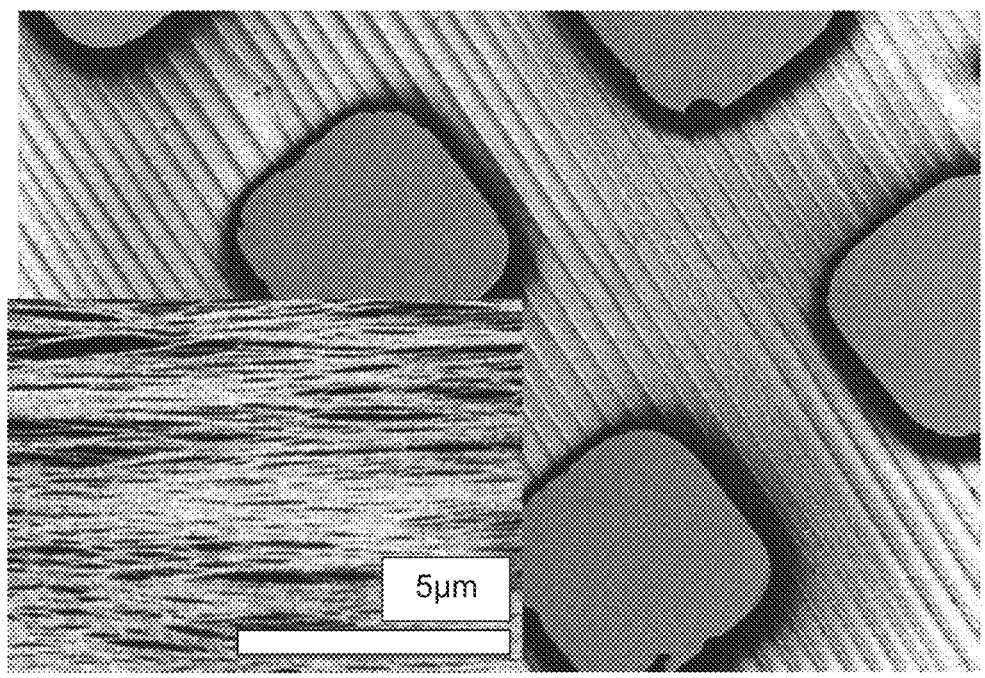
FIG. 5 is a nanoscale view of strips of parallel nanotubes forming self-assembled parallel ribbons, connected with gold contacts.

FIG. 5 is a nanoscale view of strips of parallel nanotubes forming self-assembled parallel ribbons, connected with gold contacts. To manufacture a transverse thermoelectric device, individual nanotube arrays can be fabricated via self-assembly by immersing a hydrophilic substrate in a solution of surfactant-encapsulated carbon nanotubes in water. Through a balance of surface tension and capillary forces, nanotubes form stripes along the substrate as they migrate to the liquid-solid-air interface and deposit in an aligned formation due to entropic effects. Strong oxidizers, such as nitric acid, can dope the nanotubes p-type while strong reducing agents, such as benzyl viologen, can dope them n-type. To deposit the cross-grid pattern, one implementation is to first form semiconducting nanotube stripes on a substrate, dope them p-type, and then use atomic layer deposition (ALD) to deposit a thin oxide layer. This layer acts as a diffusion barrier between dopants and also offer a fresh hydrophilic surface for the second layer of nanotubes. Proper materials selection for this layer as well as optimization of the thickness can affect the performance of the device, as a balance between hydrophilicity of the barrier, preventing a large amount of cross doping while preserving the electrical properties of top and bottom layers. The carriers do not need to tunnel through the oxide, and the nanowire layers only need to be electrically connected to each other at the periphery of the nanowires, where thermal electron-hole pair generation on one side provides carriers which are transported to, and recombine at, the other side thereby depositing their heat.

Nanotube films of semiconducting nanowires can be prepared with various doping techniques as described above or with dopants incorporated during the semiconductor fabrication process, or with dopants diffused after the semiconductor growth process. Shadow lithographic masks and contact photolithographic masks can be designed for effective transport characterization of these films, with the goal to make electrical conduction as anisotropic as possible. Both conductivity and Seebeck coefficient can be measured to characterize and optimize the thermoelectric behavior. Once independent p- and n-type layers have been demonstrated, a composite bilayer structure can be manufactured with the option of an intervening diffusive coating to separate perpendicularly oriented nanotube layers if necessary. The transverse Seebeck effect in this film can be measured by applying a thermal gradient and measuring induced orthogonal voltage.

Figure 6:
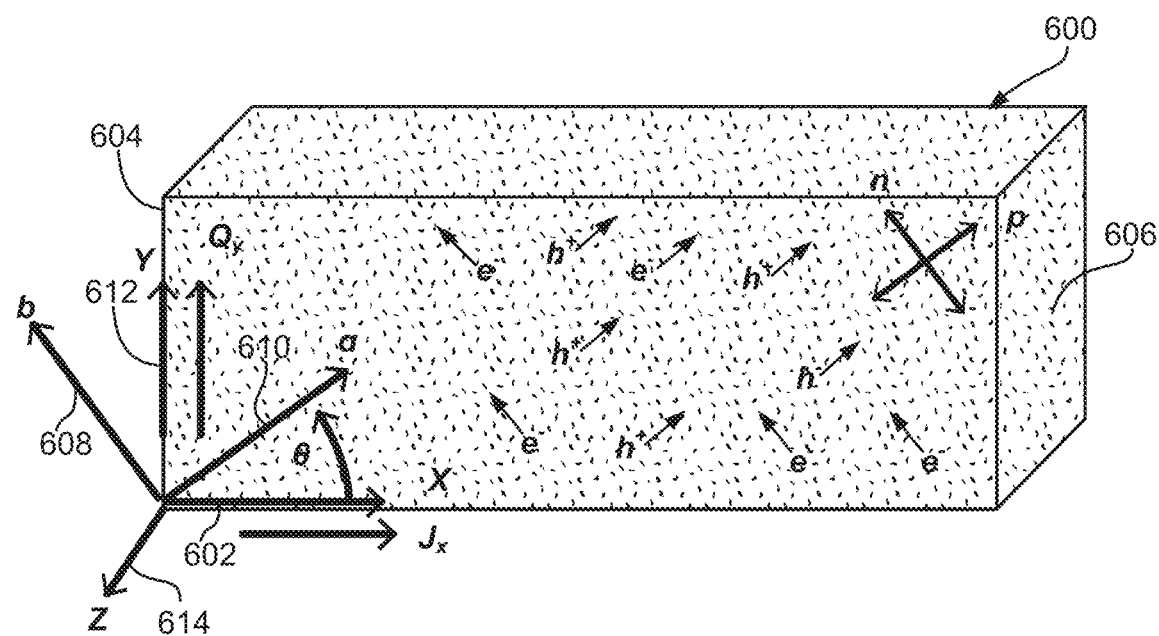
FIG. 6 is a block diagram of an exemplary semiconductor body exhibiting ambipolar transverse thermoelectric (ATT) p×n-type properties.

FIG. 6 is a block diagram of an exemplary semiconductor body 600 exhibiting ambipolar transverse thermoelectric (ATT) p×n-type properties. When an electric current is created and/or conducted through the body 600 along an x-direction 602 (e.g., from an contact joined to a first end 604 of the body 600 toward an contact joined to an opposite second end 606), electrons (e.g., "e−") in the semiconductor body 600 dominate conduction generally along directions that are parallel to a b-axis 608 and holes (e.g., "h+") in the semiconductor body 600 dominate conduction generally along direction that are parallel to an a-axis 610. The a-axis 660 of hole conduction is oriented at an angle θ to the x-direction 602 and the b-axis 608 of electron conduction is oriented at the angle θ to a y-direction 612. The x- and y-directions 602, 612 are substantially perpendicular or perpendicular to each other, and the a-axis 610 and the b-axis 608 are substantially perpendicular or perpendicular to each other.

The electron and hole conductions in the body 600 result in a net charge current Jx being conducted along the x-direction 602 through the body 600 and a net heat current Qy along the y-direction 612. The net heat current Qy represents the direction in which heat is conducted through the body 600. Controlling the angle θ based on one or more properties of layers in the semiconductor body 600 can allow for control of the directions in which heat is conducted by the semiconductor body 600 away from one or more target objects.

In order to control the angle θ, the semiconductor body 600 can be treated as having anisotropic electron and hole band conductivity tensors σn, σp, respectively, and isotropic electron and hole Seebeck tensors sn, sp, respectively. Axes a and b determine reference axes of anisotropy in the semiconductor material. The conductivity tensors and Seebeck tensors may be determined as follows:

$$\sigma_n = \begin{bmatrix} \sigma_{n,aa} & 0 \\ 0 & \sigma_{n,bb} \end{bmatrix} \quad \text{(Equation \#1)}$$

$$\sigma_p = \begin{bmatrix} \sigma_{p,aa} & 0 \\ 0 & \sigma_{p,bb} \end{bmatrix} \quad \text{(Equation \#2)}$$

$$s_n = \begin{bmatrix} s_n & 0 \\ 0 & s_n \end{bmatrix} \quad \text{(Equation \#3)}$$

$$s_p = \begin{bmatrix} s_p & 0 \\ 0 & s_p \end{bmatrix} \quad \text{(Equation \#4)}$$

In one embodiment, the values of the Seebeck tensors sn, sp, are less than zero (e.g., negative) and greater than zero (e.g., positive), respectively. A total conductivity tensor Σ and a total resistivity tensor P for the semiconductor material may be determined as follows:

$$\Sigma = P^{-1} = \sigma n + \sigma p \quad \text{(Equation \#5)}$$

In the semiconductor body 600, a total Seebeck tensor S may be determined as follows:

$$S = (\sigma_p + \sigma_n)^{-1}(\sigma_p s_p + \sigma_n s_n) \quad \text{(Equation \#6)}$$

The single-band Seebeck tensors sn and sp (e.g., the Seebeck tensors for only electrons or holes) may be isotropic (e.g., within a single band alone thermoelectric heat conduction would occur parallel or antiparallel to electrical conduction), the conductivity tensors σn, σp can be more strongly anisotropic (e.g., the electrical conduction in one direction is stronger than the perpendicular direction). A parameter ξ may be referred to as an ambipolar conductivity ratio for a designated direction within a group of the layers. The conductivity along the a-direction in the group of layers may be dominated by p-type conduction and can be determined as:

$$\xi_a = \frac{\sigma_{n,aa}}{\sigma_{p,aa}} < 1 \quad \text{(Equation \#7)}$$

The conductivity along the b-direction in the group of layers may be dominated by n-type conduction and can be determined as:

$$\xi_b = \frac{\sigma_{p,bb}}{\sigma_{n,bb}} < 1 \quad \text{(Equation \#8)}$$

The parameter $\xi$ may be used to determine how much the n-type and p-type conductions in the superlattice can weight the Seebeck effect in one or more directions in the semiconductor body 600. A total Seebeck tensor of the layers may be determined as a matrix:

$$S = \begin{bmatrix} S_{p,aa} & 0 \\ 0 & S_{n,bb} \end{bmatrix} \quad \text{(Equation \#9)}$$

where the elements in the matrix that determines the total Seebeck tensor are positive when the ambipolar conductivity ratio for that direction is below a certain threshold, for example in the a direction:

$$\xi_a < \left| \frac{S_p}{S_n} \right| \quad \text{(Equation \#10 a)}$$

and negative when the ambipolar conductivity ratio for that direction is below a certain threshold, for example in the b direction:

$$\xi_b < \left| \frac{S_n}{S_p} \right| \quad \text{(Equation \#10 b)}$$

The elements in the matrix may be determined as:

$$S_{p,aa} = \frac{S_p + \xi_a S_n}{1 + \xi_a} > 0 \quad \text{(Equation \#11 a)}$$

$$S_{n,bb} = \frac{S_n + \xi_b S_p}{1 + \xi_b} < 0 \quad \text{(Equation \#11 b)}$$

These elements result in the diagonal Seebeck tensor of the form of Eq. #9 with respect to the planes determined by the layers in one embodiment. Such a diagonal Seebeck tensor can provide off-diagonal Seebeck terms in a θ-rotated (x, y) transport basis, with a current flow vector $J=J_x \hat{x}$ defining the x-axis. A Peltier tensor Π can be used to determine a total Peltier heat flux density as $Q\Pi=\Pi J=(TS)J$, where T represents the temperature. The longitudinal and transverse components of the total Peltier heat flux density in the semiconductor body 600 may be determined as:

$$Q_{\Pi,x} = Q\Pi \cdot \hat{x} = (S_{p,aa} \cos^2 \theta + S_{n,bb} \sin^2 \theta) T J_x \quad \text{(Equation \#12)}$$

$$Q_{\Pi,y} = Q\Pi \cdot \hat{y} = (S_{p,aa} - S_{n,bb}) \cos \theta \sin \theta T J_x \quad \text{(Equation \#13)}$$

The total heat flux density $Q=Q\Pi-\kappa_c \nabla T$ includes both Peltier and thermal conduction effects, where $\kappa_c$ can determine an open-circuit thermal conductivity tensor of the semiconductor body 600 at J=0. If the thermal gradient is orthogonal to the current density $$\nabla T = \frac{dT}{dy} \hat{y},$$

then the longitudinal electric field component Ex may be constant or substantially constant throughout all or a substantial portion of the semiconductor body 600, and the heat flux component Qy may depend on y. The longitudinal current (Jx) and the transverse heat flow (Qy) in the semiconductor body can be determined as follows:

$$J_x = \frac{1}{\rho_{xx}} E_x - \frac{s_{xy}}{\rho_{xx}} \frac{dT}{dy} \quad \text{(Equation \#14)}$$

$$Q_y = T \frac{S_{yx}}{P_{xx}} E_x - (1 + Z_{xy}T) \kappa_{yy}^c \frac{dT}{dy} \quad \text{(Equation \#15)}$$

where Ex represents the longitudinal electric field in the semiconductor body 600, ρxx represents the longitudinal resistivity in the current flow direction, $\kappa_{yy}^c$ represents the open-circuit thermal conductivity tensor of the layers at J=0 in the heat flow direction.

The Seebeck tensor, S, of a material such as the semiconductor body 600 can be determined by the equation $E=S(\nabla T)$, where $\nabla T$ represents an applied temperature gradient in the semiconductor body 600 and E represents an electric field that is induced in the semiconductor body 600 by the temperature gradient. The temperature gradient can be applied to the semiconductor body 600 by exposing the semiconductor body 600 to a source of heat. If the vectors E and $\nabla T$ are non-parallel, then the Seebeck tensor is anisotropic. An anisotropic Seebeck tensor means that the Seebeck tensor has two different eigenvalues associated with two perpendicular directions. The Seebeck tensor is ambipolar if these two eigenvalues have opposite signs. A property of materials (e.g., the semiconductor body 600) with non-zero Seebeck tensors S is that an electric current density J in the materials also drives a heat flow density, Q, of the materials. This is expressed as Q=(ST)J, where T is the temperature in the material and the quantity ST determines the Peltier tensor of the material.

A complete Seebeck tensor $$S = \begin{bmatrix} S_{xx} & S_{xy} \\ S_{yx} & s_{yy} \end{bmatrix}$$

can be measured in a square sample of a material as follows. A primary axis x is determined parallel to one side of the sample. A temperature difference ΔTx is applied to the sample by heating one end of the x-axis and/or cooling the opposite end of the sample. The Seebeck tensor component Sxx represents the voltage Vx along this x-axis that is induced in the sample by the applied temperature difference, divided by the temperature difference: Sxx=V/ΔTx. A secondary axis y is determined perpendicular to x and the Seebeck tensor component Syx represents the voltage Vy along the y-axis that is induced in the sample by the same ΔTx, such that Syx=Vy/ΔTx. A thermal difference ΔTy is applied along the secondary axis of the sample and the induced voltage Vy is measured to determine another Seebeck tensor component $S_{yy}=V_y/\Delta T_y$. Due to symmetry, the final remaining component of the Seebeck tensor may be determined as $S_{yx}=S_{yx}$.

The Seebeck tensor S can be shown or determined to be ambipolar in one or more ways. In one embodiment, ambipolarity of a material (such as the semiconductor body 600) is determined by measuring the complete Seebeck tensor as described above, and determining whether eigenvalues of the complete Seebeck tensor have opposite signs. If the eigenvalues have opposite signs, the Seebeck tensor is ambipolar. If the eigenvalues do not have opposite signs, then the Seebeck tensor may not be ambipolar.

Additionally or alternatively, ambipolarity of a material such as the semiconductor body 600 may be determined by applying a temperature difference $\Delta T_x$ to the material (e.g., by positioning the material near a source of heat) and measuring electric potential differences in the material. The electric potential differences represent the voltage that is induced in the material by the temperature gradient. The electric potential differences that are measured can be measured longitudinally $V_x$ (e.g., along the direction of the thermal gradient) and transversely $V_y$ (e.g., perpendicular or substantially perpendicular to the direction of the thermal difference). If any orientation can be found such that the transverse Seebeck tensor component $S_{yx}=V_y/\Delta T_x$ associated with the measured transverse voltage is greater in magnitude than the longitudinal Seebeck tensor component $S_{xx}=V_x/\Delta T_x$ associated with the measured longitudinal voltage, then the Seebeck tensor of the material is ambipolar.

Additionally or alternatively, a temperature difference $\Delta T_x$ can be applied to the material in a first direction and the voltage $V_x$ that is induced in the material by the temperature difference can be measured. Another temperature difference $\Delta T_y$ can be applied to the material in a second direction that is oriented perpendicular or substantially perpendicular to the first direction, and the voltage $V_y$ that is induced in the material by the temperature difference can be measured. If any orientation can be found such that the Seebeck coefficient $S_{xx}=V_x/\Delta T_x$ in the first direction has an opposite sign $S_{yy}=V_y/\Delta T_y$ as the Seebeck coefficient in the second direction, then the Seebeck tensor of the material is ambipolar.

In one or more of the embodiments described above that are used to measure the ambipolarity of a material, care is taken to not introduce (e.g., inject) electric current into or through the sample from an external source.

A transverse figure of merit may be determined as:

$$Z_{xy}T = \frac{S_{xy}S_{yx}T}{\rho_{xx}\kappa_{yy}^c} \quad \text{(Equation #16)}$$

This figure of merit may be determined for the semiconductor body having the layers, and can represent the flow of heat in a transverse direction through the layers when current is conducted through the layers in another direction. For layers having larger transverse figures of merit, larger amounts of heat are conducted in one or more transverse directions when electric current is conducted through the layers. Conversely, for layers having smaller transverse figures of merit, less heat is conducted in one or more transverse directions when the same electric current is conducted through the layers.

Under steady state conditions, $\nabla \cdot J=0$ and $\nabla \cdot (Q+\bar{\mu}J)=0$, where $\bar{\mu}$ represents the electrochemical potential and $-\nabla\bar{\mu}=E$ represents the electric field. Longitudinal Joule heating $E_xJ_x$ equals to a divergence in the transverse heat flux density $Q_y$, which may be represented as:

$$\frac{dQ_y}{dy} = E_xJ_x \quad \text{(Equation #17)}$$

Equations 14, 15, and 17 may be used to determine the following differential equation:

$$0 = \frac{1}{S_{xy}S_{yx}}E_x^2 - \left[\frac{S_{xy}+S_{yx}}{S_{xy}S_{yx}} + \frac{d\ln\left(\frac{S_{yx}}{\rho_{xx}}\right)}{d\ln T}\frac{1}{S_{xy}}\right] \quad \text{(Equation #18)}$$

$$E_x\frac{dT}{dy} + \left[1 + \frac{d\ln\left(\frac{S_{yx}S_{xy}}{\rho_{xx}}\right)}{d\ln T} + \frac{1}{Z_{xy}}\frac{d\ln\kappa_{yy}^c}{dT}\right]$$

$$\left(\frac{dT}{dy}\right)^2 + \frac{1+Z_{xy}T}{Z_{xy}}\frac{d^2T}{dy^2}$$

which with constant thermoelectric coefficients becomes $$0 = \left(\frac{E_x}{S_{xy}} - \frac{dT}{dy}\right)^2 + \frac{1+Z_{xy}T}{Z_{xy}}\frac{d^2T}{dy^2} \quad \text{(Equation #19)}$$

In one embodiment, the conduction angle $\theta$ at which electric current is conducted through the layers of the semiconductor body 600 can be controlled in order to increase the transverse figure of merit for the layers in the body 600. For example, for the same semiconductor body formed from the same layers using different conduction angles $\theta$ at which electric current is conducted between the contacts can change the transverse figure of merit. As one example, the conduction angle $\theta$ at which the transverse figure of merit is larger than one or more other conduction angles $\theta$ may be determined from the following relationship:

$$\cos^2\theta_\perp = \frac{1}{1+\sqrt{\frac{\kappa_{bb}/\kappa_{aa}}{\rho_{bb}/\rho_{aa}}}} \quad \text{(Equation #20)}$$

where $\theta_\perp$ represents the conduction angle $\theta$ associated with one or more larger (or the largest) transverse figures of merits, $\kappa_{bb}$ and $\kappa_{aa}$ represent thermal conductivity tensor components of the semiconductor body 600 along the b-direction (e.g., in directions that are transverse to the conduction of current) and a-direction (e.g., in directions that are parallel to the conduction of current), respectively, and $\rho_{aa}$ and $\rho_{bb}$ represent the resistivity tensor components of the body 600 along the a- and b-directions, respectively. The transverse figure of merit that is obtained by conduction of electric current along the conduction angle $\theta_\perp$ may be determined as:

$$Z_\perp T = Z_{xy}(\theta_\perp)T = \frac{(S_{p,aa}-S_{n,bb})^2T}{\left(\sqrt{\rho_{aa}\kappa_{aa}}+\sqrt{\rho_{bb}\kappa_{bb}}\right)^2} \quad \text{(Equation #21)}$$

In order to identify materials to be used to form the layers, the band structures of the materials may be examined. In one embodiment, the layers in the semiconductor body 600 include two different layers (e.g., first and second layers alternately stacked onto each other). The first layers may be formed from a material having a relatively high valence band energy and the second layers may be formed from a material having a relatively low conduction band energy. A power factor (PF⊥) may be determined as a parameter that indicates the efficiency in which the layers transversely conduct heat when a current is applied through the layers. Additionally or alternatively, the power factor may indicate the efficiency at which the layers generate electric current when exposed to a temperature gradient. This power factor (PF⊥) can be based on the valence and conduction bands of the materials used to form the layers. In one embodiment, the power factor (PF⊥) can be determined as follows:

$$PF_\perp = \frac{(S_{p,aa} - S_{n,bb})^2}{\left(\sqrt{\rho_{aa}} + \sqrt{\rho_{bb}}\right)^2} \qquad \text{(Equation \#22)}$$

The power factor (PF⊥) can be calculated for a variety of combinations of materials, and those combinations of materials exhibiting larger power factors (PF⊥) than one or more other combinations of materials may be selected for use to form the superlattice.

The low cost and easy fabrication process make it possible to utilize the transverse thermoelectric fabric to produce thermal jackets and building coatings, and to harvest the waste heat from human bodies, houses, automobiles, industries etc. The transverse thermoelectric fabric can also provide a flexible and portable cooler for objects of various shapes, and an integrated cooling module for flexible electronics. Objects of different shapes can be cooled down by wrapping into these fabrics and applying current. The transverse thermoelectric fabrics can provide a larger cooling temperature difference compared with longitudinal thermoelectric solutions based on CNT. Cooling modules can be implemented in flexible CNT-based electronics. High voltage thermal transducers can be achieved from small thermal gradients. Such transverse thermoelectric fabrics can be a low cost and abundant material sources, flexible and durable, and easy to fabricate.

Figure 7:
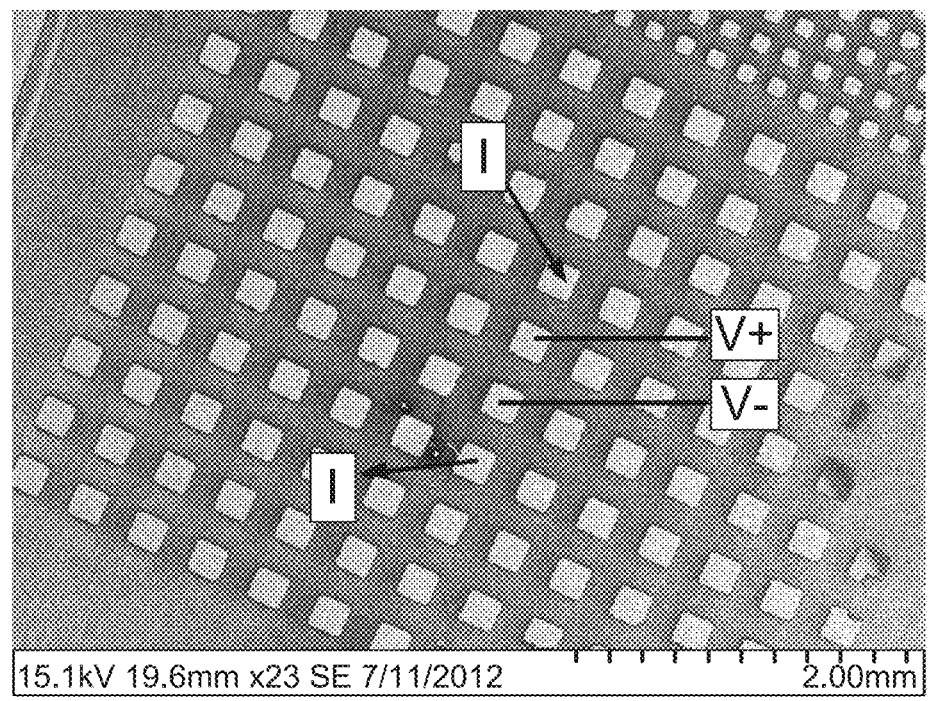
FIG. 7 is a screenshot of example scanning electron microscopy (SEM) images of aligned CNT stripes deposited on a Si substrate with $SiO_2$ insulating layer.

FIG. 7 is a screenshot of example scanning electron microscopy (SEM) images of aligned CNT stripes deposited on a Si substrate with $SiO^2$ insulating layer. Gold pads are deposited on top of CNT stripes. The 4-point technique is used to measure the longitudinal resistance between two neighboring gold pads: $R_\parallel = (V_+ - V_-)/I$.

Thermoelectric properties of as-grown p-type CNT stripes: Characterization of the thermoelectric properties of CNT stripes is used to estimate the transverse figure of merit before a real cross-hatched p×n device is made. Start with the as-grown p-type CNT stripes.

Conductivity. The average longitudinal conductivity along the stripe direction $$\sigma_\parallel = \sigma_{film,\parallel} \frac{W}{P}$$

for as-grown p-type CNT stripes is measured, where $\sigma_{film,\parallel}$ is the longitudinal conductivity of a continuous film with the same thickness as the stripes. Aligned stripes are deposited on an insulating substrate and the 4-point method can be adopted to measure the longitudinal resistance between two neighboring gold pads $R_\parallel$ (FIG. 7). The space between these square gold pads is equal to their side length, so with measured $R_\parallel$, $\sigma_\parallel = 1/R_\parallel d$ is calculated, where the average stripe thickness is d=20 nm according to the grower. The effective transverse conductivity $\sigma_\perp$ is measured to be zero due to the isolation area between stripes.

Figure 8:
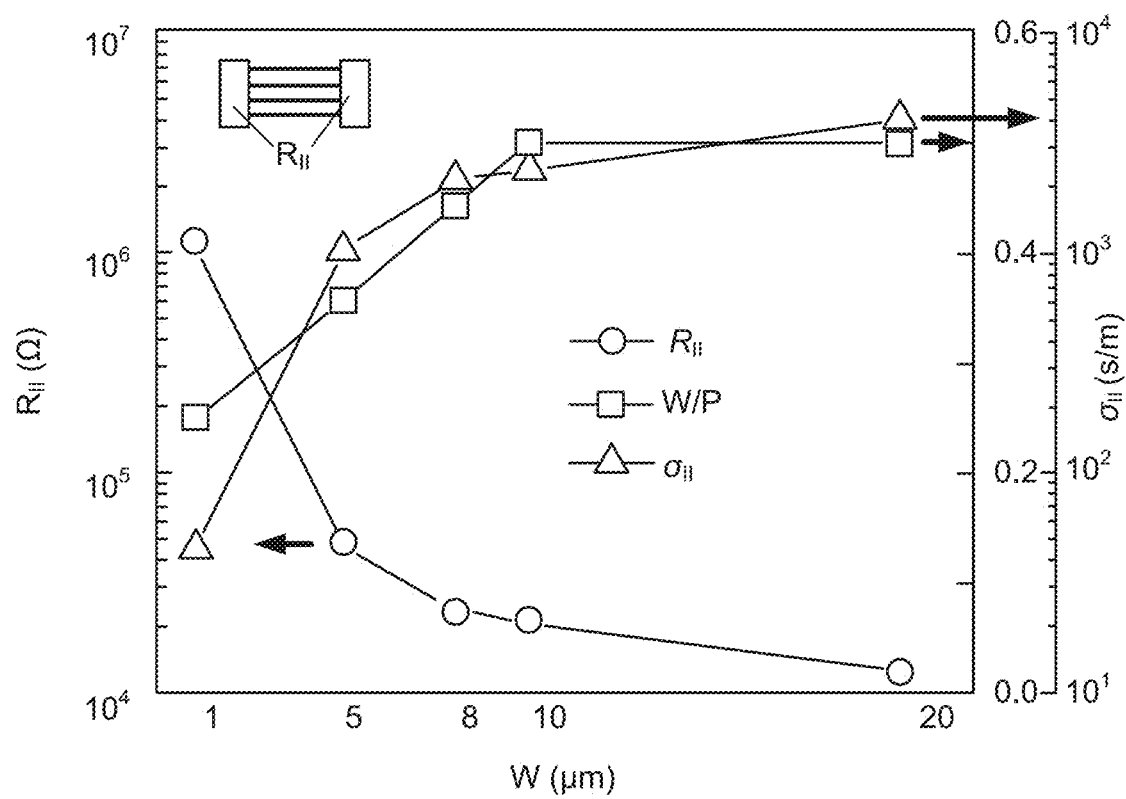
FIG. 8 is a graph of an example average longitudinal conductivity □ ∥ (triangles) for different stripe width.

FIG. 8 is a graph of an example average longitudinal conductivity σ∥ (triangles) for different stripe width. The longitudinal resistance $R_\parallel$ (circles) for multiple CNT stripes between two gold pads is measured to be decreasing with increasing stripe width W. The stripe width/pitch ratio W/P (squares) increases almost linearly when W<10 μm, and stays around 0.5 for 10 μm<W<20 μm.

$\sigma_\parallel$ increases monotonically with stripe width from 1 μm to 20 μm as shown in FIG. 8. The increasing trend is partly due to the increasing stripe width to pitch width ratio from around 0.25 to 0.5, but the trend continues between 10 μm and 20 μm where the ratio stays around 0.5, indicating that the better morphological uniformity and alignment of wider stripes also help to enhance the average longitudinal conductivity. More example data need to be collected for stripe width between 20 μm and 40 μm, but expect that $\sigma_\parallel$ further increases until stripes converge into a continuous film. The measured conductivity of $10^3$-$10^4$ S/m agrees with that of 148 nm diameter SWCNT bundle ($\sigma_\parallel$: $1 \times 10^3$ S/m) and long SWCNT strands ($\sigma_\parallel$: $3 \times 10^3$ S/m). Large $\sigma_\parallel$ for both p-type and n-type CNT stripes is preferred for a large $Z_\perp T$, thus wider stripes or even continuous thin films can be a better choice from the aspect of electrical conductivity.

Figure 9A:
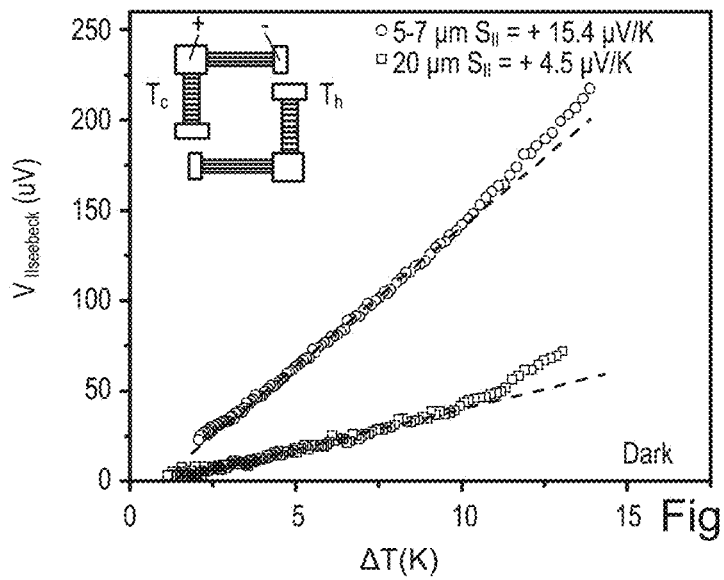
FIGS. 9A-C are graphs of example average longitudinal Seebeck coefficient.
Figure 9B:
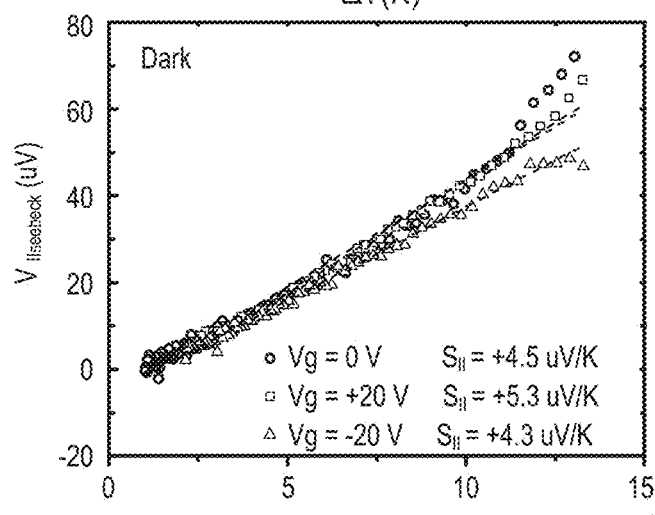
Figure 9C:
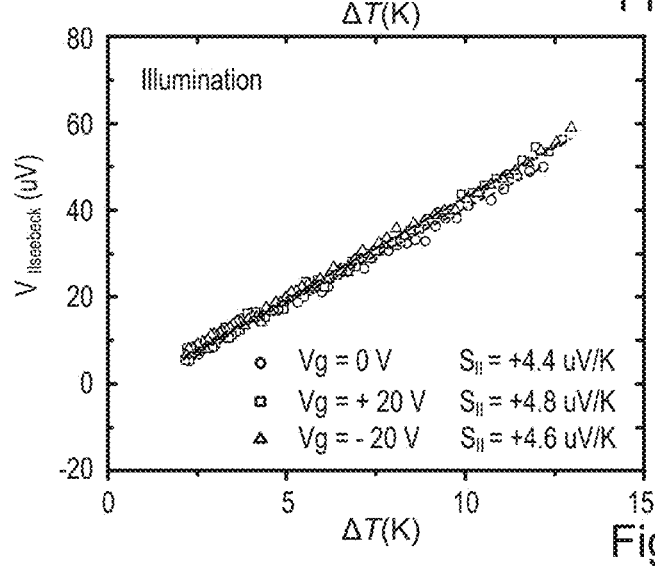

FIGS. 9A and 9B are graphs of example average longitudinal Seebeck coefficient. In FIG. 9A, average longitudinal Seebeck coefficient ($S_\perp$) for aligned p-type SWCNT stripes of different widths is illustrated. Narrower stripes (upper plot) are measured to have larger $S_\parallel$ than wider stripes (lower plot). In FIGS. 9B and 9C, average longitudinal Seebeck coefficient of 20 μm wide aligned p-type SWCNT stripes under different gate voltages in dark and under illumination are illustrated. The results show that $S_\parallel$ does not depend on gate voltage in the range of −20 V to 20 V or illumination.

The average longitudinal Seebeck coefficient $S_\parallel$ of the as-grown SWCNT stripes can be measured for two different stripe widths, with a home-made thin film microprobe Seebeck measurement module which is compatible with probe stations. Temperature difference up to 15 K can be applied to the two ends of the stripe, and the slope of the longitudinal Seebeck voltage with respect to temperature difference represents $S_\parallel$ at room temperature (FIG. 9A). The positive sign of $S_\parallel$ confirms the p-type nature of the as-grown SWCNTs.

The narrow stripes (W~5-7 μm) showed a $S_\parallel$=+15.4 μV/K, which is three times that of the wider stripes (W~20 μm) with $S_\parallel$=+4.5 μV/K. That can be caused by the mis-alignment of SWCNTs or SWCNT bundles. Transverse Seebeck coefficient of aligned SWCNT film can be larger than the longitudinal Seebeck coefficient. Earlier examples showed that the intertube or inter-bundle barriers misaligned with the temperature gradient direction will introduce a positive component of longitudinal Seebeck due to the hopping conduction through the effective tunnel barrier separating the nanotubes. Thus the longitudinal Seebeck coefficient of SWCNT stripes can be viewed as an indicator of the quality of alignment.

The power factors $S_{81}^2 \sigma_\parallel$ of 5-7 μm and 20 μm as-grown SWCNT stripes are 0.25 and 0.08 μW/K²·m respectively. More experimental data can be collected to plot the power factor as a function of stripe width and calculate the figure of merit with measured thermal conductivities. There is no observable difference of the longitudinal Seebeck coefficient in darkness (FIG. 9B) and under illumination (FIG. 9C).

The thermoelectric figure of merit of the as-grown p-type SWCNT stripes can be estimated if the thermal conductivity is known. The thermal conductivity of a film sample of SWCNTs aligned by filtration in a high magnetic field can be reported to be $\kappa_{film,\parallel}$~40 W/m K, thus the average thermal conductivity for the 5 µm wide stripe can be assumed to be $$\kappa_\parallel = \kappa_{film,\parallel} \frac{W}{P} = 8 \text{ W/mK}$$

according to its width to pitch ratio. The estimated figure of merit of this p-type SWCNT stripe is around $3.6 \times 10^{-6}$ at room temperature. If the n-type SWCNT stripes have similar thermoelectric properties, then $Z_\perp T$ are equal to the figure of merit of p-type SWCNT stripes. Such small figure of merit value is mainly due to the small conductivity and Seebeck coefficient, and indicates that the application of the cross-hatched p×n transverse thermoelectric made from these SWCNT stripes can also be used for thermal detectors.

Another approach to create cross-hatched nanowire arrays for p×n transverse thermoelectrics is layered ion implantation. Ion implantation can be used to define the insulating regions in planar micro-electronic devices, where the implanted regions have increased resistivity compared with the non-implanted regions due to the crystal defects created in the implantation. For a p×n transverse thermoelectric embodiment, conductive nanowire arrays can be defined via lithographic patterning in an initial p-semiconducting layer, separating neighboring wires with ion implantation. Subsequent regrowth of a n-semiconducting layer then undergoes the same implantation, but orthogonal to the p-wires. Such cross-hatched nanowire arrays will be electrically conductive along the wire direction, but almost insulating in the direction transverse, providing the anisotropic conductivity needed in p×n transverse thermoelectrics. One advantage of the ion-implantation isolation technique is the adaptability to various materials, e.g., nanowire arrays can be formed in any doped semiconductors such as Si, GaAs, AlGaAs, Bi2Te3, Bi2Se3 etc. Another advantage of ion implantation is that it preserves the surface smoothness compared with etch-based isolation techniques. As a result, alternative p- and n-type planar layers can be grown on top of each other in succession.

Figure 10:
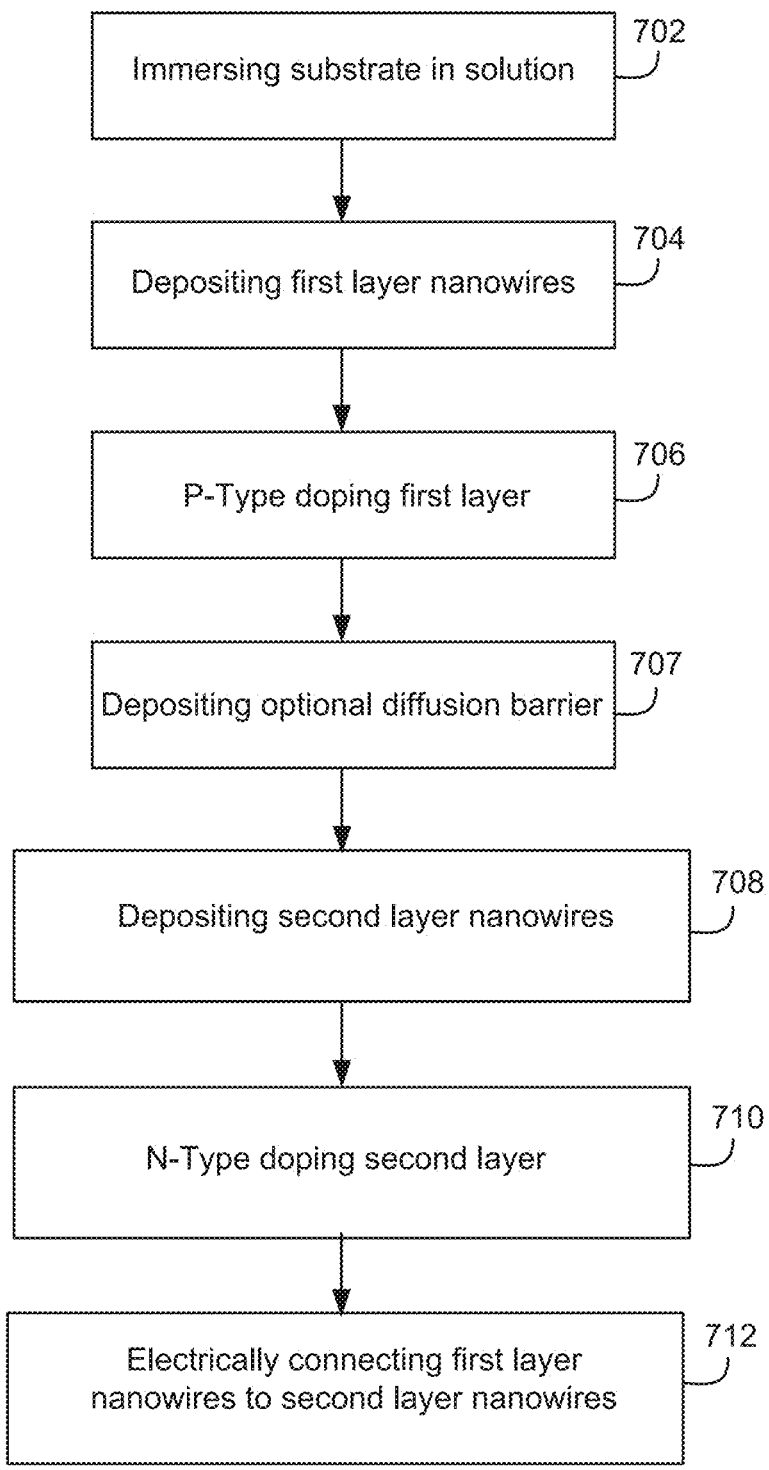
FIG. 10 is a flow chart of an example for manufacturing a transverse thermoelectric device.

FIG. 10 is a flow chart of an example for manufacturing a transverse thermoelectric device. Individual nanowires can be fabricated by immersing a substrate in a solution of surfactant-encapsulated nanowires in water, through a balance of surface tension and capillary forces (702), forming a first layer nanowires along the substrate as the nanowires migrate to a liquid-solid-air interface and deposit in an aligned formation due to entropic effects (704), followed by a p-doping step (706). The optional diffusion barrier 302 can be deposited (707). Then and a second layer of nanowires is deposited (708), and subsequently n-doped (710). The first layer of nanowires is p-type doped with oxidizers (706) and the second layer of nanowires n-type doped with a reducing agent (710). The second layer of nanowires (708) can be deposited in a cross-grid pattern relative to the first layer of nanowires (704). The first layer of nanowires can be electrically connected to the second layer of nanowire (712).

While various embodiments have been described, it can be apparent that many more embodiments and implementations are possible. Accordingly, the embodiments are not to be restricted.

The invention claimed is:

1. A transverse thermoelectric device, comprising:
a single layer of first array of nanowires;
a single layer of second array of nanowires positioned below relative to the single layer of first array of nanowires;
a single substrate for providing a continuous structure fully supporting to both the single layer of first array of nanowires and the single layer of second array of nanowires, where the single layer of first array of nanowires and the single layer of second array of nanowires are oriented at a finite angle to each other, where the single layer of first array of nanowires, the single layer of second array of nanowires and the single substrate are formed in a unitary meandering shape structure; and
first and second contacts joined to opposite ends of the single layer of first and the single layer of second array of nanowires to provide a net electrical current input to both the single layer of first and the single layer of second array of nanowires and a net electrical current output to both the single layer of first and the single layer of second array of nanowires, where net electrical current is made of positive charge carriers that flow parallel to the single layer of first array of nanowires and negative charge carriers that flow parallel to the single layer of second array of nanowires to provide heat flow in-plane of the single layer of first and single layer of second array of nanowires and perpendicular to the net electrical current.

2. The transverse thermoelectric device of claim 1, where the single layer of first array of nanowires is configured to flow electrons.

3. The transverse thermoelectric device of claim 2, where the single layer of first array of nanowires is n-doped.

4. The transverse thermoelectric device of claim 1, where the single layer of second array of nanowires is configured to flow holes.

5. The transverse thermoelectric device of claim 4, where the single layer of second array of nanowires is p-doped.

6. The transverse thermoelectric device of claim 1, where at least one of the single layer of first array of nanowire and the single layer of second array of nanowires comprise carbon nanotubes.

7. The transverse thermoelectric device of claim 1, where at least one of the single layer of first array of nanowire and the single layer of second array of nanowires comprise gallium arsenide, indium arsenide, germanium, silicon, bismuth selenide, or bismuth telluride.

8. The transverse thermoelectric device of claim 1, where the single substrate comprises a flexible polymer.

9. The transverse thermoelectric device of claim 1, where the single layer of first array of nanowires and the single layer of second array of nanowires are configured to cool a surface when a current is applied.

10. The transverse thermoelectric device of claim 1, where the single layer of first array of nanowires and the single layer of second array of nanowires are configured to generate a voltage based on a temperature difference.

11. The transverse thermoelectric device of claim 1, where neighboring nanowires are produced from a semiconducting sheet in which individual wires are separated with ion implantation.

12. The transverse thermoelectric device of claim 1, further comprising a first diffusion barrier positioned between the single layer of first array of nanowires and the single layer of second array of nanowires.

13. The transverse thermoelectric device of claim 12, where the first diffusion barrier comprises a dielectric.

14. The transverse thermoelectric device of claim 13, where the dielectric is inorganic.

15. The transverse thermoelectric device of claim 12, where the first diffusion barrier comprises a dopant.

16. The transverse thermoelectric device of claim 12, further comprising a second diffusion barrier, where the single layer of first array of nanowires and the single layer of second array of nanowires are positioned between the second diffusion barrier and the substrate.

17. The transverse thermoelectric device of claim 1, where heat flow is extracted to create a voltage or drive an electrical current.

18. The transverse thermoelectric device of claim 1, where the finite angle between the single layer of second array of nanowires and the single layer of first array of nanowire comprises substantially ninety degrees.

19. The transverse thermoelectric device of claim 1, where the finite angle of net electrical current to the single layer of first array of nanowires and the single layer of second array of nanowires comprises substantially forty-five degrees.

* * * * *